(12) United States Patent
Hwang

(10) Patent No.: US 6,746,777 B1
(45) Date of Patent: Jun. 8, 2004

(54) ALTERNATIVE SUBSTRATES FOR EPITAXIAL GROWTH

(75) Inventor: Wen-Yen Hwang, Sugar Land, TX (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 59 days.

(21) Appl. No.: 09/820,072

(22) Filed: Mar. 28, 2001

Related U.S. Application Data
(60) Provisional application No. 60/208,115, filed on May 31, 2000.

(51) Int. Cl.$^7$ .................... H01L 29/06; H01L 31/109
(52) U.S. Cl. .................... 428/457; 428/615; 428/620; 428/641; 428/457; 428/689; 428/700; 257/9; 257/183
(58) Field of Search ................... 428/615, 620, 428/641, 642, 457, 689, 700; 257/9, 183, 189–191

(56) References Cited

U.S. PATENT DOCUMENTS

| | | | |
|---|---|---|---|
| 5,285,086 A | | 2/1994 | Fitzgerald, Jr. |
| 5,294,808 A | | 3/1994 | Lo |
| 5,513,204 A | | 4/1996 | Jayaraman |
| 5,633,516 A | * | 5/1997 | Mishima et al. ............ 257/190 |
| 5,719,894 A | | 2/1998 | Jewell et al. |
| 5,754,578 A | | 5/1998 | Jayaraman |
| 5,914,976 A | | 6/1999 | Jayaraman et al. |
| 5,981,400 A | | 11/1999 | Lo |
| 6,372,356 B1 | * | 4/2002 | Thronton et al. ............ 428/469 |
| 6,406,795 B1 | * | 6/2002 | Hwang et al. ............... 428/457 |

OTHER PUBLICATIONS

Matthews, J. W. and Blakeslee, A. E., "Defects in Epitaxial Multilayers," *Journal of Crystal Growth 27*, (1974), pp. 118–125.

Parillaud et al., "High Quality InP on Si by Conformal Growth," *Appl. Phys. Lett. 68*, (1996), p. 2654.

Lo, Yu–Hwa, "Long Wavelength Vertical Cavity Surface Emitting Lasers," *Hot Topic*, Feb. 1995, p. 20–21.

Qian et al., "1.3μm Vertical–Cavity Surface–Emitting Lasers with Double–Bonded GaAs–AlAs Bragg Mirrors," *IEEE Photonics Technology Letters*, vol. 9, No. 1, Jan. 1997, pp. 8–10.

(List continued on next page.)

*Primary Examiner*—Tom Thomas
*Assistant Examiner*—Joseph Nguyen
(74) *Attorney, Agent, or Firm*—N. Stephan Kinsella; Mason A. Gruss

(57) ABSTRACT

A substrate including a base substrate, an interfacial bonding layer disposed on the base substrate, and a thin film adaptive crystalline layer disposed on the interfacial bonding layer. The interfacial bonding layer is solid at room temperature, and is in liquid-like form when heated to a temperature above room temperature. The interfacial bonding layer may be heated during epitaxial growth of a target material system grown on the thin film layer to provide the thin film layer with lattice flexibility to adapt to the different lattice constant of the target material system. Alternatively, the thin film layer is originally a strained layer having a strained lattice constant different from that of the target material system but with a relaxed lattice constant very close to that of the target material system, which lattice constant is relaxed to its relaxed value by heating the interfacial bonding layer after the thin film layer is removed from the first semiconductor substrate, so that the thin film layer has an adjusted lattice constant equal to its unstrained, relaxed value and very close to the lattice constant of the target material system.

28 Claims, 5 Drawing Sheets

OTHER PUBLICATIONS

Uchiyam et al., "Continuous–Wave Operation up to 36°C of 1.3μm GaInAsP–InP Vertical–Cavity Surface–Emitting Lasers," *IEEE Photonics Technology Letters*, vol. 9, No. 2, Feb. 1997, pp. 141–142.

Dudley, et al., "Low Threshold, Wafer Fused Long Wavelength Vertical Cavity Lasers," *Appl. Phys. Lett. 64 (12)*, Mar. 1994, pp. 1463–1465.

Xiong, Yanyan and Lo, Yu–Hwa, "Current Spreading and Carrier Diffusion in Long–Wavelength Vertical–Cavity Surface–Emitting Lasers," *IEEE Photonics Technology Letters*, vol. 10, No. 9, Sep. 1998, pp. 1202–1204.

Salet et al., "Undercut Ridge Structures: A Novel Approach to 1.3/1.55μm Vertical–Cavity Lasers Designed for Continuous–Wave Operation," *IEEE Proc.–Optoelectron.*, vol. 145, No. 2, Apr. 1998, pp. 125–131.

Salet et al., "Room–Temperature Pulsed Operation of 1.3μm Vertical–Cavity Lasers Including Bottom InGaAsP/InP Multilayer Bragg Mirrors," *Electronics Letters.*, vol. 33, No. 24, Nov. 1997, pp. 2048–2049.

Salet et al., "Gas–Source Molecular–Beam Epitaxy and Optical Characterisation of Highly–Reflective InGaAsP/InP Multilayer Bragg Mirrors for 1.3μm Vertical–Cavity Lasers," *Electronics Letters.*, vol. 33, No. 13, Jun. 1997, pp. 1145–1147.

Qian, et al., "Submilliamp 1.3μm Vertial–Cavity Surface–Emitting Lasers With Threshold Current Density of <500A/cm$^2$," *Electronics Letters*, vol. 33, No. 12, Jun. 1997, pp. 1052–1054.

* cited by examiner

ALTERNATIVE SUBSTRATES FOR EPITAXIAL GROWTH

CROSS-REFERENCES TO RELATED APPLICATIONS

This nonprovisional U.S. national application, filed under 35 U.S.C. §111(a), claims, under 37 C.F.R §1.78(a)(3), the benefit of the filing date of provisional U.S. national application No. 60/208,115, entitled "Fabrication of Vertical Cavity Surface Emitting Lasers Using Alternative Substrates," by Wen-Yen Hwang, filed May 31, 2000 under 35 U.S.C. §111(b), the entirety of which is incorporated herein by reference.

BACKGROUND OF THE INVENTION

1. Field of the Invention

This invention is related to substrates for epilayer epitaxial growth in which the epilayers are lattice mismatched to the substrate and, in particular, to alternative substrates for fabrication of electronic and optoelectronic devices, such as semiconductor diode lasers, for example vertical-cavity surface-emitting lasers (VCSELs).

2. Description of the Related Art

The following descriptions and examples are not admitted to be prior art by virtue of their inclusion within this section.

Lasers, such as semiconductor diode lasers, have a wide range of industrial and scientific uses. The use of semiconductor diode lasers as sources of optical energy is attractive for a number of reasons. For example, diode lasers have a relatively small volume and consume a small amount of power as compared to conventional laser devices. Further, as monolithic devices, they do not require a combination of a resonant cavity with external mirrors and other structures to generate a coherent output laser beam. One disadvantage of the semiconductor diode laser, however, is the relatively low power of the output beam, as compared to other types of laser devices.

Group III–V ("III≧V") semiconductor materials have been used to construct semiconductor lasers. Processing of III–V semiconductor devices includes vital steps for depositing III–V materials on a semiconductor substrate. For the deposition of a thick III–V layer, the lattice constant of the substrate material has to be very close to that of the deposited III–V layers (epi layers) with the same crystalline structure. Otherwise, crystalline defects, especially threading dislocations, will form during material deposition. When the defect density in the deposited material is high, it will significantly degrade device performance. These threading dislocation defects can create leakage paths for current, provide undesired carrier recombination centers and reduce device lifetime.

It is thus very difficult to grow high quality thin film materials on conventional prior art substrates with a large lattice mismatch. This lattice-matching requirement for compound semiconductor material deposition severely limits the possible choice of compound semiconductor material compositions and device material structure designs due to the limited choice of available substrates with the appropriate crystalline structures and lattice constants. Such substrates include Si, GaAs, InP, GaSb, InAs, and sapphire, inter alia.

For material systems for which there are no lattice-matched prior art substrates, however, some alternative approaches have been used. E.g., either a thick buffer layer is grown on the substrate, as proposed in U.S. Pat. No. 5,285,086, or a special technique, such as the lateral growth method proposed by Parillaud et al., *Appl. Phys. Lett.* vol. 68 (1996), p. 2654, is employed before the growth of the device structure layers. It is known that defects, in particular threading dislocations, induced by lattice mismatch can be reduced from $10^{11}/cm^2$ to $10^5/cm^2$ by using the lateral growth method, for example. However, lattice-mismatched material growth techniques that result in defects, especially threading dislocation defects, often cause undesirable performance or characteristics of optoelectronic or electronic devices grown with such techniques.

It is desirable to epitaxially fabricate a variety of types of structures or devices, using a given epi material system, grown on a given substrate. Such epitaxially fabricated devices include electronic devices, such as transistors and integrated circuits, and optoelectronic devices, such as semiconductor lasers, light-emitting diodes, and photodetectors.

One such optoelectronic device in which there has recently been an increased interest is the vertical-cavity surface-emitting laser (VCSEL). The conventional VCSEL has several advantages, such as emitting light perpendicular to the surface of the die, and the possibility of fabrication of two dimensional arrays. VCSELs typically have a circular laser beam and a smaller divergence angle, and are therefore more attractive than edge-emitting lasers in some applications. Long infra-red spectrum wavelength (e.g., the range from approximately 1.2 μm to approximately 1.8 μm, including closely-spaced wavelengths around 1.3 μm or closely-spaced ITU grid wavelengths around 1.55 μm) VCSELs are also of great interest in the optical telecommunications industry because of the minimum fiber dispersion at 1.32 μm and the minimum fiber loss at 1.55 μm. The dispersion shifted fiber will have both minimum dispersion and minimum loss at 1.55 μm. The long wavelength VCSEL is typically based on an $In_xGa_{1-x}As_yP_{1-y}$ active layer lattice matched to InP cladding layers.

The structure of a typical VCSEL usually consists of an active region sandwiched between two distributed Bragg reflector (DBR) mirrors, as shown schematically in FIG. 1. For the fabrication of long wavelength (e.g., 1.3 or 1.55 μm) VCSELs, it is very difficult to form the desired materials in one single growth step on a substrate. For instance, it is difficult to grow either the desired 1.3 μm active region on a GaAs substrate or to grow proper DBR mirrors on an InP substrate, despite the maturity of the technology for growing the DBR structure on GaAs substrates. Likewise, it is difficult to grow a 1.3 μm wavelength DBR structure on an InP substrate, despite the maturity of the technology for growing the active region. Recently, some alternative material systems, such as InGaNAs, GaAsSb and InGaAs quantum dots, have been developed to grow directly on a GaAs substrate using an $Al_xGa_{1-x}As/Al_yGa_{1-y}As$ DBR for a 1.3 μm wavelength active region. However, these material systems are very difficult to grow and not easy to reproduce.

Another alternative approach to fabricate a long wavelength VCSEL is by using the so-called wafer bonding technique. However, this approach requires at least two to three wafer growth and one to two wafer-to-wafer bonding processes, which leads to very high fabrication cost and very low device yield. Therefore, a single wafer growth approach would be preferable to the wafer bonding approach, other considerations being equal.

One alternative approach to fabricate a long wavelength VCSEL with a single wafer growth step is to use the (In,Ga,Al)As material system lattice matched to $In_x(Al_yGa_{1-y})_{1-x}As$, where, e.g., 0.15<x<0.45, and growth of an InAlGaAs/InAlAs DBR structure and a moderately strained InGaAs quantum well (QW) structure active region. (Depending on the value of x, y is selected such that the material utilized has a bandgap absorption edge less than the lasing wavelength, e.g. less than 1.3 $\mu$m for a 1.3 $\mu$m VCSEL.) However, there is no commercially available substrate that is lattice matched to this material system. It is very difficult to control the composition precisely of a ternary $In_xGa_{1-x}As$ substrate uniformly over a whole wafer. Therefore, a high quality alternative substrate needs to be developed for this application.

One approach is to create a substrate that has the same crystalline structure and the same surface lattice constant as those of non-strained $In_x(Al_yGa_{1-y})_{1-x}As$, where $0.15<x<0.45$. Another approach is to make a substrate that has a thin layer that is physically attached to the substrate, but can freely expand in a direction parallel to the substrate surface during material growth. This thin surface layer must have the same crystalline structure and a similar lattice constant as those of non-strained $In_x(Al_yGa_{1-y})_{1-x}As$, where $0.15<x<0.45$.

For lattice-mismatched epitaxial layers, it is widely accepted that there exists a critical thickness beyond which misfit dislocations are introduced causing the breakdown of coherence between the substrate and epitaxial layers. The relaxation mechanism for lattice-mismatched epilayers known as the Matthews-Blakeslee model, and other aspects of epitaxial, layer lattice mismatching problems are discussed in J. W. Matthews, S. Mader & T. B. Light, *J. Appl. Phys.* 41 (1970): 3800; J. W. Matthews & A. E. Blakeslee, "Defects in Epitaxial Multilayers I," *J. Cryst. Growth* 27 (1974): 118–125; J. W. Matthews & A. E. Blakeslee, "Defects in Epitaxial Multilayers II," *J. Cryst. Growth* 29 (1975): 273–280; J. W. Matthews & A. E. Blakeslee, "Defects in Epitaxial Multilayers III," *J. Cryst. Growth* 32 (1976): 265–273; and J. W. Matthews, *J. Vac. Sci. Technol.* 12 (1975): 126.

U.S. Pat. No. 5,294,808 for "Pseudomorphic and Dislocation Free Heteroepitaxial Structures" proposes to use a thin substrate having a thickness on the order of the "critical" thickness, which is the thickness at which defects form when growing one lattice mismatched material on another. The critical thickness is only a few hundred angstroms, and it is difficult to sustain the mechanical and chemical processes required for epitaxial (epi) growth and device fabrication on a substrate having a thickness of only a few hundred angstroms. However, in practical situations, after the thin substrate is bonded to the supporting substrate, the bonding strength between the interface is so strong that this thin substrate can no longer freely change its lattice constant in the in-plane direction. Therefore, threading dislocations will still be generated due to the very limited strain accommodation in the thin substrate.

There is, therefore, a need for improved substrates and fabrication techniques that address the foregoing problems. In general, there is a need for alternative substrates that can be used for a variety of epi material systems without giving rise to conventional problems caused by lattice mismatch between the epi layers and the substrate. For example, there is a need for alternative substrates that address the problems associated with lattice mismatching between a substrate and the (In,Al,Ga)As material intended to be used for long (e.g., 1.3 or 1.55 $\mu$m) wavelength VCSELs or other special material systems. Such alternative substrates could be advantageously used for other material systems and device structures as well, and in general for any material system for which other substrates cannot satisfy the lattice-matching requirement for device applications.

BRIEF DESCRIPTION OF THE DRAWINGS

Other objects and advantages of the invention will become apparent upon reading the following detailed description and upon reference to the accompanying drawings in which.

DETAILED DESCRIPTION OF THE INVENTION

Figure 1:
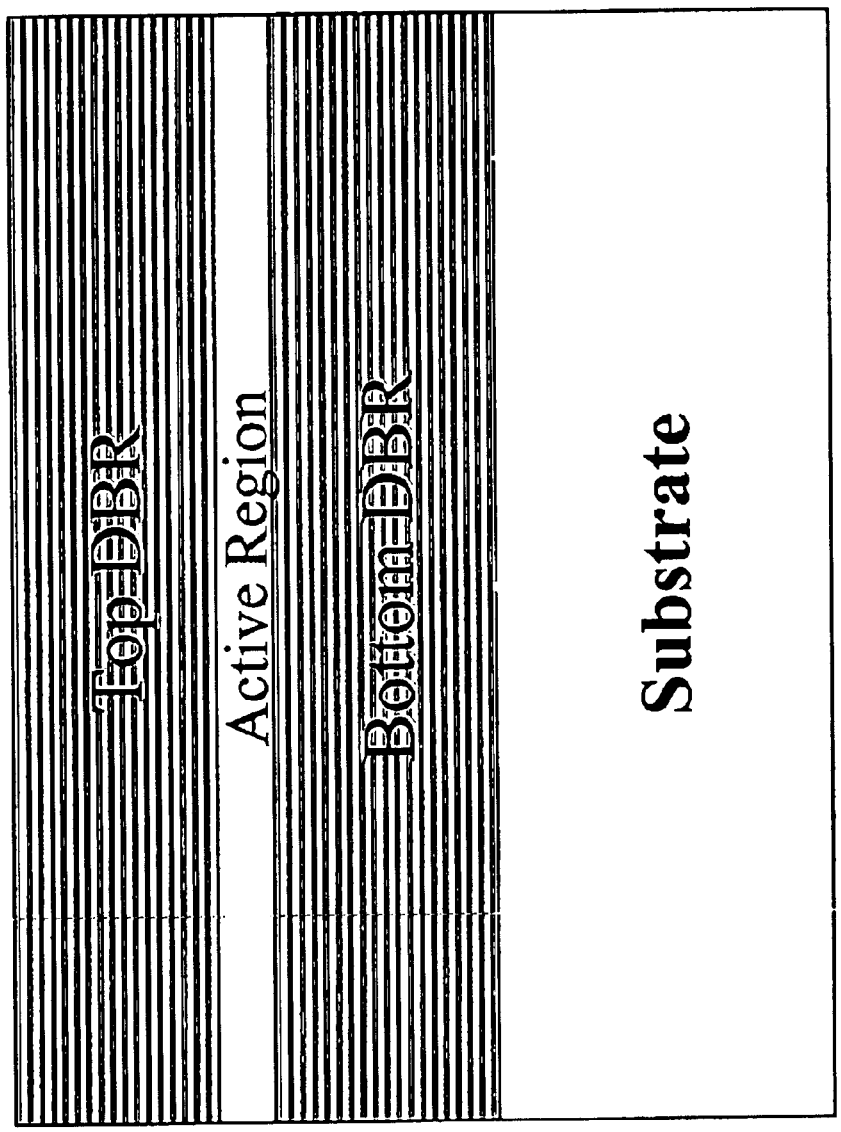
FIG. 1 is a cross-sectional view of a typical layer structure of a vertical cavity surface emitting laser (VCSEL) device.

Commonly-owned U.S. patent application Ser. No. 09/426,273, filed Oct. 25, 1999, for "Compliant Universal Substrates for Optoelectronic and Electronic Devices," is incorporated by reference herein in its entirety.

To address the problem of lattice mismatch between a prior art substrate and (In,Al,Ga)As material intended to be used for a long wavelength (e.g., 1.3 or 1.55 $\mu$m) VCSEL or other special material systems, an alternative substrate is provided for growth of high quality pseudomorphic epitaxial (epi) thin films without generating high-density threading dislocations. The aternative substrate of the present invention preferably allows high quality compound semiconductor thin film growth and also endures all the material epitaxy and device fabrication processing steps. The present invention provides alternative substrates using wafer fusion or wafer bonding techniques that facilitate the formation of high quality devices on these alternative substrates.

According to the present invention, an alternative substrate has a base layer and a thin film layer physically bonded to the substrate. Two basic approaches to providing an alternative substrate for defect-free (or reduced defect) epitaxial growth are disclosed herein: the floating substrate approach and the relaxed substrate approach, which are described in further detail below. Depending on the approach employed, the adaptive thin film layer either (a) has a lattice constant different from that of the target epi material system, but with a sufficient degree of lattice flexibility during epitaxial growth of the target material system, due to the presence of a floating interfacial bonding layer, to permit the lattice constant of the adaptive thin film layer to adjust to that of the target system, thereby providing lattice match and reducing lattice mismatch threading dislocations; or (b) the thin film layer, which is initially strained and has lattice mismatch with the target material system, has its in-surface lattice constant adjusted by relaxation before epi growth so that it has a lattice constant very close to that of the target material system. In the second approach, the thin film layer may be bonded to a base layer with or without an interfacial bonding layer, in alternative embodiments.

The present invention thus provides an alternative substrate for the formation of various devices with special target epi material systems, such as approximately 1.2 μm to approximately 1.8 μm wavelength VCSELs. The alternative substrate includes a base layer and a thin film crystalline layer on and bonded to the base layer, with or without an interfacial bonding layer, depending on the embodiment. The thin film layer's lattice constant is adjusted either during epi growth to accommodate the different lattice constant of the target epi layers; or is adjusted prior to the epi growth to create a thin film layer lattice-matched to the target material system. In either case, an interfacial bonding layer is employed to adjust the thin film layer's lattice constant, whether before or during epi growth. This approach can also be used for other material systems for different device applications, as will be appreciated by those skilled in the art.

Figure 2:
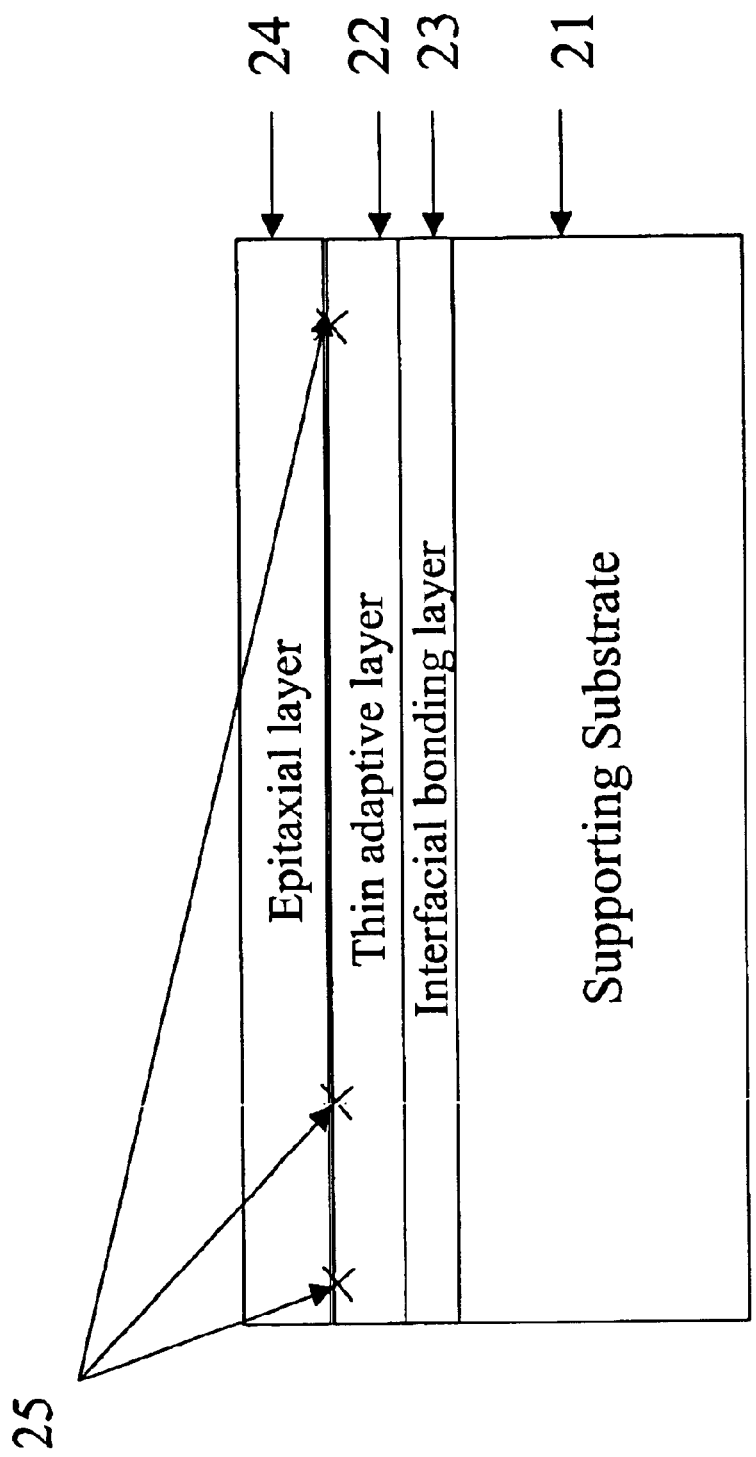
FIG. 2 is a schematic diagram illustrating a generic layered structure employed to form defect-free epitaxial layers on an alternative substrate, in accordance with an embodiment of the present invention.

FIG. 2 schematically illustrates an alternative substrate 20 in accordance with an embodiment of the present invention. Alternative substrate 20 is a multilayer structure having a thick bulk material base layer or substrate 21 and a thin film adaptive layer 22, which is bonded to the bulk material base layer 21 with an interfacial bonding layer 23. The thin film adaptive layer 22 serves as the actual substrate that supports growth of an epi layer 24 in a growth chamber. The thin film adaptive layer 22 could have a thickness from approximately 5 nm or less to approximately a few microns (μm), depending on application and design. The thin film adaptive layer 22 is mechanically robust when it is bonded to the base layer 21. The interfacial bonding layer 23 may be a thin metal(s) layer, an inorganic layer, or a combination of any materials listed below. Alternatively, interfacial bonding layer 23 may simply be the interface formed between the treated (i.e., cleaned) surface layers substrate 21 and thin adaptive layer 22, in alternative embodiments.

When bonding layer 23 is a metal layer, for example, it may be formed of one or more metal layers. For example, it may be a single-layer of Bismuth (Bi), or other metals such as Pb, In, Sn, Sb, Al, or the like. Some alloys with low melting temperatures (e.g., <600° C. or 500° C.) can also be used, such as In:Sn, Pb:Sn, In:Pb, In:Ag, or other element or alloy. Bonding layer 23 may have a single layer, or two, three, or more layers of metals and/or alloys. As described below, the layer structure and materials of the metal bonding layer 23 are preferably selected to avoid undesired chemical reaction with the thin adaptive layer 22 and supporting substrate 21.

The layer 23 is preferably in solid form at temperatures under 100° C. and provides sufficient bonding strength between the layers 21 and 22 to hold them together for material processing and fabrication purposes, i.e., for mechanical stability. The interfacial bonding layer 23 May actually comprise a thin interfacial layer that could vanish after bonding layer 22 to layer 21, or could be as thick as approximately a few micrometers, depending, in part, on the embodiment.

In accordance with an embodiment of the invention, there are two different basic techniques to make an alternative substrate for VCSELs (e.g., for 1.3 or 1.55 μm wavelength light output) based on $In_x(Al_yGa_{1-y})_{1-x}As$, where, for example, 0.15<x<0.45. Other ranges for x may also be employed in alternative embodiments. It is understood that all mole fractions hereinafter are exactly or approximately the value at the indicated extremes previously given unless otherwise indicated, as will be appreciated by those skilled in the art.

According to a first embodiment or approach, the thin adaptive layer 22 is made to accommodate the difference between its lattice constant and that of the epitaxial layer during epitaxial growth of layer 24, which will be referred to as the "floating substrate approach." According to a second embodiment or approach, the in-plane lattice constant of the thin adaptive layer 22 is modified before epitaxial growth, such that it has the same (in-plane) lattice constant as that of the target material during epitaxial growth of layer 24. This will be referred to as the "relaxed substrate approach." For the case of a 1.3 or 1.55 μm VCSEL, the target material can be, for example, $In_x(Al_yGa_{1-y})_{1-x}As$, where 0.15<x<0.45. Other target material systems may be employed as well.

Floating Substrate Approach

According to one embodiment, the floating substrate approach is achieved using the interfacial bonding layer 23 between the thin adaptive layer 22 and the supporting substrate 21, as indicated above. In this approach, thin adaptive layer 22 has a different lattice constant than that of the target material system, but has a lattice flexibility during epi growth. During epi growth of epi layer 24, the interfacial bonding layer 23 becomes liquid, partially liquid, or liquid-like (hereinafter referred to as liquid-like) after the substrate 21 is heated up to a temperature higher than room temperature (i.e., "liquidizes"), for example, higher than 100° C. When the interfacial layer 23 becomes liquid-like, the thin adaptive layer 22 physically floats freely on the interfacial layer 23 and has the degrees of freedom to expand or contract its lattice constant to adapt to the lattice constant of the epitaxial layer being grown thereof. The liquid-like state of the interfacial bonding layer 23, after substrate heating, allows the layer 22 to change its lattice constant without generating (or reduces the occurrence of) threading dislocations, and/or channels any threading dislocations into the adaptive layer instead of upward, into the growing epi layer 24.

Thus, in this embodiment, interfacial bonding layer 23 must not be merely an interface that is vanishingly small; it must be an actual layer having a finite thickness sufficient to perform the floating function to give thin adaptive layer 22 lattice flexibility during epi growth of epi layer 24. The interfacial layer 23 is preferably thin enough that its surface tension will not destroy the thin adaptive layer 22 when it is in the liquid-like state. The interfacial layer 23 also preferably has a viscosity such that the thin adaptive layer 22 and the epitaxial layer 24 will not fall off or shift (e.g., slide laterally) during material epitaxy or device processing. The interfacial layer 23 further does not react or alloy (or minimally reacts or alloys) chemically with the thin film adaptive layer 22, which reacting could otherwise destroy layer 22 (e.g., when it is heated to become liquid-like during epi growth of epi layer 24).

Substrate or base layer 21 can be formed from any commercially available high quality substrate material, such as Si, GaAs, InP, GaP, or the like. However, the thin film adaptive layer 22 can be made from either the same material or a variety of other materials as the base layer 21. Thin adaptive layer 22 is preferably a semiconductor layer to facilitate growth thereon of semiconductor based epi layers and devices in epi layer 24.

Figure 3D:
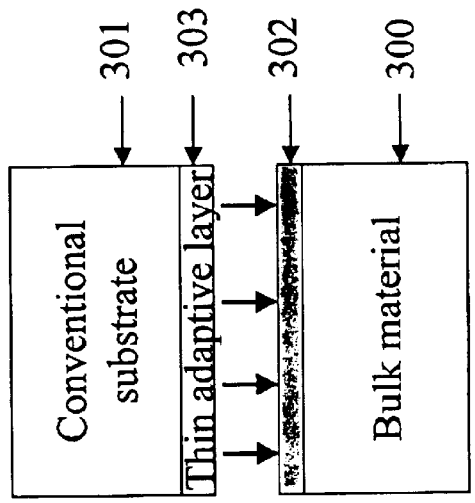
FIGS. 3A, B, C, D, and E are schematic illustrations of a process employed to fabricate an alternative substrate in accordance with an embodiment of the present invention.
Figure 3E:
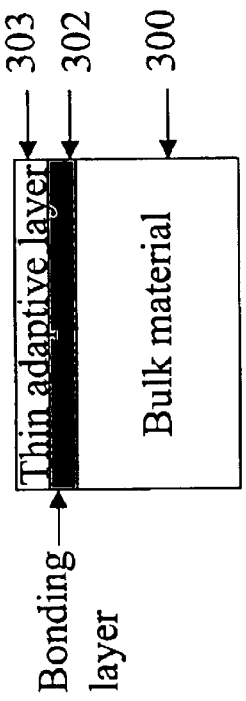
Figure 3A:
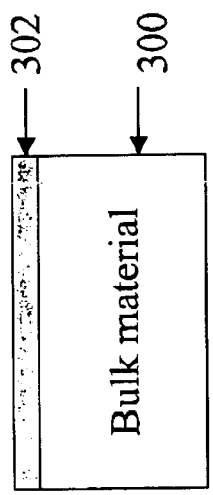
Figure 3B:
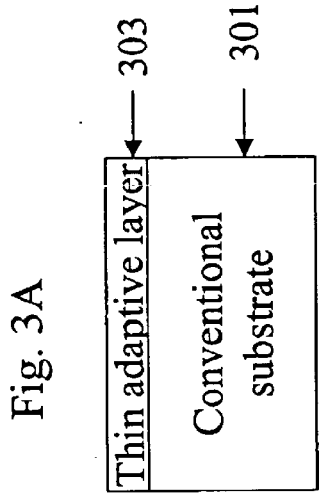

FIGS. 3A–E illustrate a method for fabricating an alternative (sometimes referred to as a compliant universal (CU)) substrate such as illustrated in FIG. 2, in accordance with the floating substrate approach, according to an embodiment of the present invention. In FIGS. 3A and 3B, first and second wafers 300 and 301 are provided, each of which is formed from a suitable bulk substrate material, for example, Si, GaAs, InP, GaSb, GaP, InAs, or the like. It should be emphasized that any suitable material may be employed as the substrate material, including both semiconductor and non-semiconductor materials. The wafer 300 may undergo a process (such as e-beam evaporation, thermal evaporation, or sputtering) to deposit a thin top bonding layer 302 on the substrate 300, as shown in FIG. 3A.

Figure 3C:
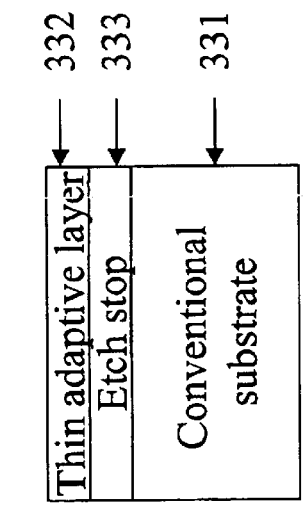

In one aspect of the invention, as shown in FIG. 3C, an etch-stop layer 333 is formed on an alternative second wafer substrate 331 having the thin adaptive layer 332 disposed thereon. The etch stop layer 333 may be AlGaAs, InGaP, InAlP, or the like. The thin adaptive film layer 332 is formed on the etch stop layer 333 using any suitable conventional technique, such as molecular beam epitaxy (MBE); liquid phase epitaxy (LPE); or a vapor phase epitaxy (VPE) process such as or metalorganic chemical vapor deposition (MOCVD, also known as MOVPE). A thin bonding layer also could be formed on top of the thin adaptive layer 332. Alternatively, in another embodiment, thin film adaptive layer 303 is formed directly on the second wafer 301, as shown in FIG. 3B.

Next, as illustrated in FIG. 3D, the second wafer 301 is inverted relative to the first wafer 300, and the thin film layer 303 is bonded to the top surface bonding layer 302 of the first wafer 300. The joining of the two wafers 300 and 301 can be the result of Van der Waals forces, hydrogen bonding, covalent bonding, ionic bonding, or the like, or any other mechanism, and results in the bonding layer 302, as shown in FIG. 3E, becoming a finite thickness interfacial layer. In some embodiments, pressure is applied during the wafer bonding process. Depending on the detailed process conditions and the bonding mechanisms, the applied pressure can vary from approximately zero to over approximately 10 MPascal or higher. Finally, as illustrated in FIG. 3E, the conventional substrate second wafer 301 is removed by a selective etching (or lift off) technique, as will be appreciated by those skilled in the art. The etch stop layer 333 may be used to prevent removal of any of the thin film layer 332 if the wafer 331 is used. The exposed thin film layer 332 (or 303) can be used as a CU substrate platform for epitaxial growth, while the wafer 300 now becomes the supporting bulk material base layer (effective substrate).

Alternatively, instead of depositing bonding layer 302 on substrate 300, the thin bonding layer 302 could be deposited on top of the surface of thin adaptive layer 303 or 332, for wafer bonding, depending on the process design. Or, bonding layer 302 may be deposited partially on substrate 300, and partially on adaptive layer 303 or 332, so that after the step shown in FIG. 3D, a bonding layer is disposed between thin adaptive layer 303 and the bulk material 300, as shown in FIG. 3E.

Whether bonding layer 302 is deposited on substrate 300, or layer 302/332, or partially on both, the bonding layer may be a single or multilayer metal, as described above with reference to bonding layer 23.

Relaxed Substrate Approach

In the relaxed substrate approach of the present invention, the lattice constant of the thin adaptive layer 22 (FIG. 2) is modified before bonding it to the supporting substrate 21. Preferably, the lattice constant of thin adaptive layer 22 is modified to match the lattice constant of the material system of epi layer 24 which is to be grown thereon. This is done by selecting the material for adaptive layer 22 so that its relaxed (i.e., unstrained, or "natural," or "original") lattice constant is very close to, or the same as, that of a target material system to be grown as epi layer 24. Then, thin adaptive layer 22 is grown on a first substrate having a different material and thus a different lattice constant than the thin adaptive layer, giving rise to a strained thin adaptive layer having a strained lattice structure different than the non-strained (relaxed) lattice constant. However, the thin adaptive layer 22 is thin enough so that, although it is strained, there are no threading dislocations.

A first surface of the thin film layer is then bonded to a surface of a second, supporting substrate (incidentally having a lattice constant different from that of the thin film layer); with a flexible interfacial bonding layer. The first substrate is removed, and the an interfacial bonding layer is used, similar to the relaxation approach described above with respect to the floating substrate approach, to relax the thin adaptive layer, to adjust its lattice constant to its non-strained, relaxed value. Thereafter, the now-non-strained thin adaptive layer is preferably mounted on another substrate or support, e.g. bulk material (with our without a second interfacial bonding layer), and the first bonding layer and its supporting substrate is removed from the thin adaptive layer. The thin adaptive layer 22, supported by a bulk material substrate, may then be utilized to grow an epi layer thereon lattice matched to the non-strained lattice constant of the thin adaptive layer.

This process results in an alternative substrate for the formation of semiconductor devices, which substrate has a crystalline base layer and/or bulk material, and, on the base layer, a thin film layer having a lattice constant very close to that of the target material system. In this approach, interfacial bonding layer 23 may be merely an interface between the base and the adjusted thin film layer, because it need not provide the floating function during epitaxial growth of epi layer 24 that it provides in the floating substrate approach. Alternatively, interfacial bonding layer 23 may be a real layer having finite thickness.

Referring now to FIG. 4, there is illustrated a method of fabricating an alternative in accordance with the relaxed substrate approach of the present invention. In FIG. 4, the foregoing steps are illustrated in further detail with respect to carrier (support) substrate 400 and conventional substrate 402. First, a high-quality thin adaptive layer 403 (i.e., corresponding to layer 22 of FIG. 2) is grown on a conventional (first) substrate 402. The thin adaptive layer 403 needs to have a relaxed lattice constant which is very close to that of a target material system. For example, the target material system may be $Ga_xIn_{1-x}As$ where, e.g., x=20%, i.e. $Ga_{0.20}In_{0.80}As$. In this case, $Ga_{0.20}In_{0.80}As$ may also be selected for the material for thin adaptive layer 403, so that its relaxed lattice constant and crystalline lattice structure is identical to that of the target material system for the epi layers to be grown thereon. To fabricate a thin layer 403 of $Ga_{0.20}In_{0.80}As$, a lattice-mismatched substrate such as GaAs or InP may be used. This will give rise to a strained-lattice layer, having a different lattice constant than non-strained (relaxed) $Ga_{0.20}In_{0.80}As$.

The thickness of the thin adaptive layer 403 is preferably smaller than its critical thickness (e.g., <100 Å) such that no dislocation generation or lattice relaxation will or will likely occur. Quality and thickness control of the strained thin adaptive layer 403 is preferable for this process. As will be understood by those skilled in the art, after its fabrication on substrate 402, the lattice constant of the strained adaptive layer 403 is the same as that of the substrate 402 in the direction parallel to the wafer surface. However, as described below, this lattice constant of layer 403 is relaxed to its non-strained value through a special process in accordance with the present invention.

Figure 4C:
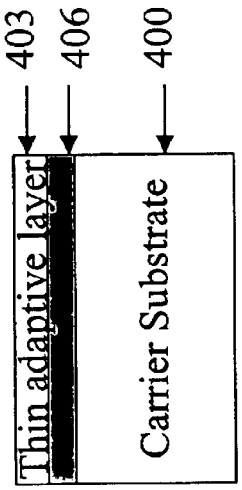
FIGS. 4A, B, C, and D are schematic illustrations of another process employed to fabricate an alternative substrate in accordance with an embodiment of the present invention.
Figure 4D:
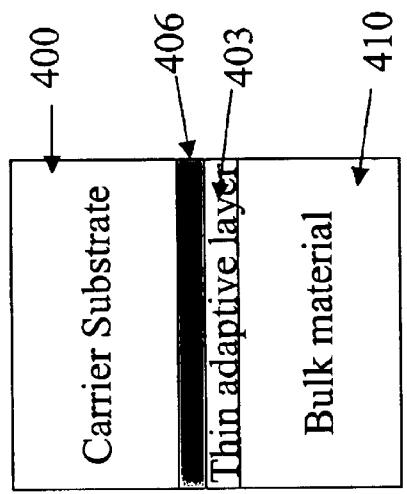
Figure 4A:
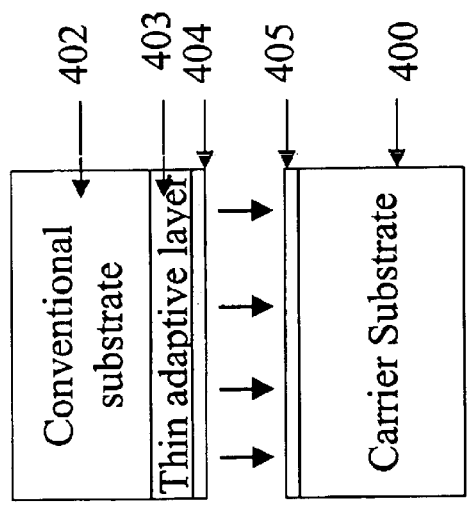
Figure 4B:
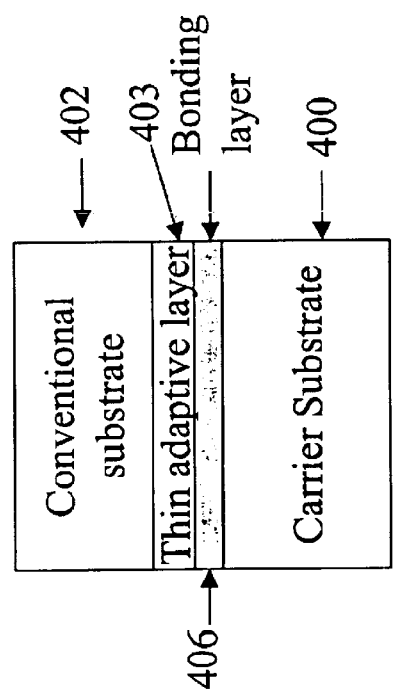

Thus, after forming strained adaptive layer 403 on substrate 402, thin bonding layers 404 and 405 are deposited on the thin adaptive layer 403 and the carrier (second) substrate 400, respectively, as shown in FIG. 4A. (Alternatively, only one of bonding layers 404, 405 may be employed.) Then, the two substrates are put together face-to-face and bonded together, as illustrated in FIG. 4B, to form a bonding layer 406 from the thin bonding layers 404 and 405. This bonding process may be accomplished by applying heat or pressure, or a combination of both, to the two wafers, as will be appreciated by those skilled in the art. Bonding layers 404, 405 may comprise suitable materials, such as the materials utilized for forming interfacial bonding layer 23, or other suitable metals or other materials.

After the two wafers are bonded together, the conventional (first) substrate 402 is etched away, leaving only the thin adaptive layer 403 on the bonding layer 406, mounted on second, carrier substrate 400 (FIG. 4C). Then, heat is applied to the carrier substrate 400, as in FIG. 4C, until the interfacial bonding layer 406 becomes liquid-like, such that the thin adaptive layer 403 can freely change its lattice constant to its relaxed value, to relieve internal strain. After the thin adaptive layer 403 is relaxed, then the carrier substrate 400 can be cooled down and the bonding layer 406 is re-solidified. Thus, after cooling, this results in a now-relaxed in adaptive layer 403 which has a relaxed lattice constant, which is identical to, or at least closer to, that of the target material system. This layer 403 may then be used as the alternative substrate, when mounted on a proper support, to permit epitaxial growth of the target material system, with reduced threading dislocation defects.

In one embodiment, the result shown in FIG. 4C may be used as an alternative substrate, after appropriate treating of the top (exposed) surface of thin adaptive layer 403. In this case, carrier substrate 400 serves as the support. However, preferably, thin adaptive layer 403 is bonded to a new (third), bulk material support substrate 410, as shown in FIG. 4D. In this embodiment, thin adaptive layer 403 is bonded to a new bulk substrate 410, which can be a prior art semiconductor substrate or a dielectric crystal substrate that has a thermal expansion coefficient very close to that of the thin adaptive layer 403 (to reduce fracturing or damage during heating). The final step is to remove the carrier substrate 400 and bonding layer 406. This may be done by chemical etching, or by mechanical removal by melting the bonding layer 406. The exposed surface of thin adaptive layer 403, after layers 400 and 406 are removed, may then be suitably treated to permit epitaxial growth thereon of the target material system.

Bonding layer 406 may consist of any suitable bonding layer material. The bonding layers 406 and 302 (FIG. 3) preferably have the proper chemical and physical properties, including: (1) no or insignificant chemical reaction with the thin adaptive layer 403 or 303 (or 332); (2) solid at room temperature, e.g., up to approximately 100° C.; (3) liquid-like form when heated to an elevated temperature (e.g., approximately 100–500° C.); (4) physically strong hold of the carrier substrate 400 (or the bulk material 300) and the thin adaptive layer 403 (or 303) together, and (5) no or insignificant physical or chemical damage to the thin adaptive layer 403 (or 303) upon heating. The bonding layers 406 and 302 can be, for example, metals (e.g., as described above with reference to bonding layer 23), inorganic materials, or organic materials.

Preferably, thin adaptive layers 303, 403 are semiconductor materials, so that semiconductor devices may be grown thereon. Carrier substrate 400 need not be a semiconductor, but need only be strong enough to act as a support during the process illustrated in FIG. 4. Bulk material 410, on the other hand, while it need not be a semiconductor, preferably has a thermal expansion coefficient close to that of thin adaptive layer 403, to prevent cracking or other undesirable effects during changes in heat. Bulk material 300 need not be a semiconductor, but should be strong enough to support layer 302. Preferably, the thermal expansion coefficient for substrate 300 is not very different from that of thin adaptive layer 303, although in an embodiment it need not be as closely matched as for substrate 410 and thin adaptive layer 403, because bonding layer 302 is between layer 303 and substrate 300 during epitaxial growth on layer 303.

Thus, the present invention provides, in the relaxed substrate approach, for the formation of an alternative substrate for epitaxial growth of a target material system. The alternative substrate comprises a thin film adaptive crystalline layer bonded to a base substrate layer. The thin film layer may be said to have an unstrained lattice constant equal or very close to the lattice constant of the target material system, where the thin film layer originally (in formation) had a stained lattice constant equal to the lattice constant of a first semiconductor substrate on which it is grown, which strained lattice-constant has been adjusted by bonding the thin film adaptive layer to a carrier substrate with an interfacial bonding layer and removing the first substrate, and then heating the interfacial bonding layer to liquidize the interfacial bonding layer to allow the strained pseudomorphic thin film adaptive layer to relax to its unstrained lattice structure, and then bonding the thin film layer to the base substrate and removing the carrier substrate to expose an epitaxial growth surface of the thin film adaptive layer. The thin film adaptive layer may be referred to herein as a relaxed-strained or unstrained-stained thin film layer to indicate that it was fabricated a strained layer with a first (strained) lattice constant and then relaxed, via the interfacial bonding layer technique, to adjust its lattice constant to the natural, unstrained lattice constant for the material of the thin film layer.

As mentioned above, these alternative substrate fabrication techniques of the disclosed embodiments, for example, for a 1.3 or 1.55 $\mu$m wavelength VCSEL, also can be applied to other material systems for different device applications. With reference to FIGS. 3A–3E and 4A–AE, three different exemplary material systems for the method described above will now be discussed.

Exemplary Material Systems

I. GaInAs/InP

The thin adaptive film 303 or 332 (or 403) can be, for example, an InGaAs thin film with an In composition approximately 15% to approximately 45%. Its thickness can be, for example, approximately 3 nm to approximately 30 nm. The second wafer or second substrate 301 or 331 (or 402) can be, for example, InP. As the lattice constant of $Ga_xIn_{1-x}As$, 0.2<x<0.45, is smaller than that of InP, if a layer is grown whose thickness is less than its critical thickness, then no or little additional threading dislocation defects will or will likely be formed during the growth of this thin epitaxial layer. In this embodiment, the thin film 303 or 332 (or 403) is a pseudomorphic tensile strained epitaxial layer. The thin film 303 or 332 (or 403) can be bonded in any orientation relative to the bulk material substrate 300 (or the substrate 410), which may be GaAs, InP, Si, sapphire, or other suitable materials. Thin adaptive layer 303 or 403 may be composed of InGaAsP, GaSb, InGaAs, InGaP, AlGaP, InSb, InP, AlSb, or InAS, SiC, Ge, GaP, InAs, GaSb, or the like. However, a relative orientation of approximately 0° or approximately 90° is usually preferred when considering device processing control of the sample.

II. GaInAs/GaAs

The thin adaptive film 303 or 332 (or 403) can be, for example, an InGaAs thin film with an In composition between approximately 15% and approximately 40%. Its thickness can be, for example, approximately 3 nm to approximately 50 nm. The second wafer or second substrate 301 or 402 can be, for example, GaAs. As the lattice constant of $Ga_xIn_{1-x}As$, where $0.15<x<0.40$, is larger than that of GaAs, if a layer is grown whose thickness is less than its critical thickness, then no or little additional threading dislocation defects will or will likely be formed during the growth of this thin epitaxial layer. In this embodiment, the thin adaptive film 303 or 332 (or 403) is a pseudo-morphic compressive strained epitaxial layer, which can be bonded in any crystalline orientation relative to the substrate 300 (or 400). The substrate 300 (or 400) can be, for example, GaAs, InP, Si, sapphire, SiC, Ge, GaP, InAs, Gasb, or the like. However, a relative orientation of approximately 0° or approximately 90° is usually preferred when considering device processing control of the sample.

III. GaSb/InAs or InAs/GaSb

The substrate 301 (or 402) can be, for example, either InAs or GaSb. Whichever material is chosen, i.e., InAs or GaSb, the thin adaptive film layer 303 or 332 (or 403) can be, for example, the other of these two materials, and have a thickness approximately 3 nm to approximately 30 nm. As the lattice mismatch between InAs and GaSb is less than 0.7%, the GaSb or InAs thin film is not relaxed and no or little threading defects should be formed in the epi layer. The thin adaptive film 303 or 332 (or 403) can be bonded in any orientation relative to substrate 300 (or 400), which can be, for example, GaAs, InP, Si, sapphire, SiC, Ge, GaP, InAs, GaSb, or the like. However, a relative orientation of approximately 0° or approximately 90° is usually preferred when considering device processing control of the sample.

These are just a few examples of possible ways to fabricate CU substrates according to the present invention. There are many other ways to achieve a CU substrate using different III–V materials, as will be appreciated by those skilled in the art. However the principle of the present invention is the same as for the above examples, and these other ways are included, within the scope and spirit of the present invention.

Non-limiting exemplary metal materials having low melting temperatures (e.g., below 600° C. or 500° C., typical temperatures used for MBE) that can be used as the bonding layer 302 (or 406) include, for example, Bi, Pb, In, Sn, Sb, Al, or the like. Some alloys with low melting temperatures (e.g., <600° C. or 500° C.) can also be used, such as In:Sn, Pb:Sn, In:Pb, In:Ag, and the like. The bonding layer 302 (or 406) also can comprise multiple metal layers, such as layer combinations of these metals for which some of the layers have a much higher melting temperature.

In summary, the present invention provides alternative substrates that may be formed from conventional semiconductor and other bulk materials that facilitate growth of lattice-mismatched threading dislocation defect-free epitaxial layers. This is accomplished through provision of a thin adaptive film layer, which is highly flexible due to an interfacial bonding layer that becomes liquid-like upon heating. The present invention thereby facilitates the formation of a wide range of devices that were previously not feasible to construct due to lattice mismatch constraints. A list follows of exemplary potential applications of this alternative substrate technology.

Exemplary Potential Applications

A variety of devices can be fabricated using the CU substrate provided in the present invention, including electronic devices such as transistors and integrated circuits; and optoelectronics devices, such as lasers (including diode lasers, VCSELs, and the like), LEDs and photodetectors.

I. High-Power Mid-Infrared Lasers

Figure 5:
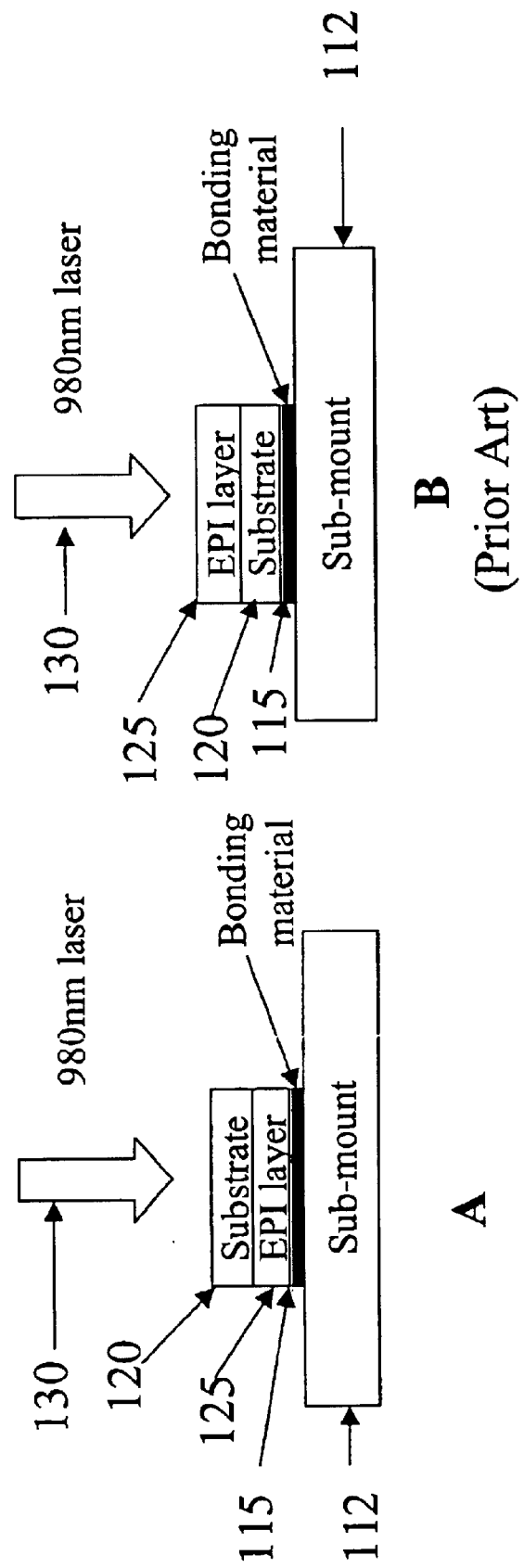
FIG. 5A is a schematic illustration of the epi-up configuration for laser mounting in output power measurement, according to the invention.
FIG. 5B is a schematic illustration of the prior art epi-down configuration for laser mounting in output power measurement.

Referring now to FIGS. 5A and 5B, there are shown, respectively, schematic illustrations of the epi-up configuration for laser mounting in output power measurement, according to the invention, and a prior art epi-down configuration for laser mounting in output power measurement. Pump laser 130 provides optical pumping light for the laser of epi layer 125. In FIG. 5A, layer 120 may comprise layers 403 and 410 of FIG. 4, or layers 303, 302, 300 of FIG. 3.

Sb-base type-II quantum well (QW) or superlattice (SL) lasers emitting from approximately 2 to approximately 10 μm can be grown and fabricated according to the invention on the GaAs CU substrates. The laser active region is composed of but not limited to either InAs/InGaAlSb/InAs/ InAlSb type-II QWs or InAs/InGaAlSb type-II SLs. The advantage of growing such lasers on the GaAs CU substrate is that the laser can be bonded on a submount 112 in the epi-down configuration, as schematically shown in FIG. 5A, instead of the prior art epi-up configuration, as schematically shown in FIG. 5B. This is because, in the prior art, a substrate had to be utilized which is lattice matched to the epi layers, which often limited the choice to materials that were opaque to the pumping light from pump laser 130. By utilizing the CU substrate of the present invention, a substrate which is transparent to the pumping flight may be utilized, even though it is not lattice matched to the epi layers 125. By using the epi-down configuration, the maximum laser output power can be dramatically improved with better heat removal capability from the laser active region.

II. Mid-Infrared (IR) and IR Photodetectors

High performance IR photodetectors for detecting wavelengths approximately 2 to approximately 25 μm can be composed of InAlGaAs/InAlGaSb type-II SLs lattice matched to GaSb or InAs substrates. However, both InAs and GaSb substrates highly absorb radiation at wavelengths longer than approximately 5 μm. Therefore, epi-side down mounting to the read out circuits is very difficult to use. IR photodetectors can be grown and fabricated according to the invention on large bandgap CU substrates, and hence such photodetectors can be integrated with read out circuits using the epi-down configuration to allow light to pass from the CU substrate. An alternative substrate, such as a thin GaSb layer bonded on top of a GaAs or Si substrate, can be used as a filter to filter out the visible and ultraviolet (UV) spectra.

III. Visible and UV Laser Diodes

Red, orange, and yellow/green diode lasers having InGaAlP heterostuctures can be grown and fabricated according to the invention on GaAs-based CU substrates without being restricted by available lattice-matched substrates. High-quality InGaN/AlGaN ultraviolet, blue, and green lasers with a long lifetime and low defect density can be grown and fabricated according to the invention on CU substrates. In the prior art, these devices are grown on sapphire or SiC substrates with a large lattice mismatch. This produces a very high defect density and strongly limits device lifetime. These devices according to the present invention can be used, for example, in displays, DVDs for optical data storage, medical applications, and chemical sensors to monitor band-to-band transitions of gas species.

IV. High-Temperature, High-Power, High Voltage Electronic Devices

Transistors composed of InGaAlN and SiC heterostructures can sustain high voltage, high temperature, and deliver high power. These are attractive features for the power industry and the microwave communications industry. The electrical qualities of InGaAlN and SiC compounds grown and fabricated according to the invention on CU substrates are or likely are superior to those grown on other mismatched substrates for both carrier mobility and breakdown voltage.

V. High-Efficiency Visible LEDs

Red, orange, and yellow/green LEDs having InGaAlP heterostructures can be grown and fabricated according to the invention on GaAs-based CU substrates. LEDs emitting from red to UV wavelengths can be constructed with InGaN/InGaAlN heterostructures grown and fabricated according to the invention on Si or other CU substrates. The CU substrates are more attractive than sapphire or SiC substrates currently being used from both cost and electrical property standpoints.

VI. Optoelectronic Integrated Circuits and Electronic Circuits with Mixed Materials III–V compound lasers can be integrated with Si circuits, according to the invention, likely more easily than by using the existing integration techniques, such as flip chip bonding and epitaxial lift off. It is also possible to work on the whole wafer instead of a fraction of the wafer, as in the flip chip bonding and epitaxial lift off techniques.

It will be understood that various changes in the details, materials, and arrangements of the parts which have been described and illustrated above in order to explain the nature of the present invention may be made by those skilled in the art without departing from the principle and scope of the present invention, as recited in the following claims.

What is claimed is:

1. A substrate comprising:
   a base substrate;
   an interfacial bonding layer disposed on the base substrate; and
   a thin film adaptive crystalline layer disposed on the interfacial bonding layer, wherein:
      the interfacial bonding layer is solid at approximately 100° C. and acquires a liquid-like form at a bonding layer melting point lower than the melting points of the base substrate and the thin film adaptive crystalline layer;
      the thin film adaptive crystalline layer has a degree of flexibility to expand or contract its lattice constant along a direction parallel to a surface of the substrate when the interfacial bonding layer is in liquid-like form; and
      the base substrate is mechanically strong enough to support the interfacial bonding layer and the thin film adaptive crystalline layer thereon.

2. The substrate of claim 1, wherein the thin film adaptive crystalline layer comprises approximately the same crystalline lattice structure as $In_x(Al_yGa_{1-y})_{1-x}As$, wherein x is approximately 15% to approximately 45%.

3. The substrate of claim 1, wherein the substrate comprises a substrate for formation of a vertical cavity surface emitting laser based on $In_x(Al_yGa_{1-y})_{1-x}As$.

4. The substrate of claim 3, wherein x is approximately 15% to approximately 45%.

5. The substrate of claim 1, wherein the bonding layer melting point is less than approximately 600° C.

6. The substrate of claim 5, wherein the compound semiconductor comprises InP, GaAs, GaSb, or InAs.

7. The substrate of claim 1, wherein the thin film adaptive crystalline layer comprises InGaAs with an In composition between approximately 15% and approximately 45%.

8. The substrate of claim 1, wherein the thin film adaptive crystalline layer comprises a compound semiconductor.

9. The substrate of claim 1, wherein the base substrate comprises a semiconductor, an inorganic material, a metal, or a combination thereof.

10. The substrate of claim 9, wherein the semiconductor comprises GaAs, InP, GaP, Si or Ge, wherein the inorganic material comprises sapphire, poly-crystalline BN, or ceramics, and wherein the metal comprises Bi, In, Pb, Sn, Al, Ni, or metal alloy.

11. The substrate of claim 1, wherein the interfacial bonding layer comprises a single layer of the same material, or multiple layers of different materials.

12. The substrate of claim 11, wherein the single layer of the same material or the multiple layers of different materials comprise
   Bi, In, Pb, Sn, Al, or Ni; or
   a metal alloy; or
   inorganic materials.

13. The substrate of claim 1, wherein the interfacial bonding layer comprises multiple thin metal films, wherein at least some of the films have a liquid-like form at the bonding layer melting point.

14. The substrate of claim 13, wherein the bonding layer melting point is less than approximately 600° C.

15. The substrate of claim 1, wherein the expansion or contraction of the lattice constant accommodates material epitaxial growth.

16. The substrate of claim 1, wherein the interfacial bonding layer has a finite thickness sufficient to provide the thin film adaptive crystalline layer with said degree of flexibility when the interfacial bonding layer is in liquid-like form and the interfacial bonding layer is thin enough that its surface tension will not destroy the thin film adaptive crystalline layer when the interfacial bonding layer is in liquid-like form.

17. The substrate of claim 1, wherein the bonding layer melting point is less than approximately 700° C.

18. The substrate of claim 1, wherein the bonding layer melting point is less than approximately 500° C.

19. An optoelectronic apparatus, comprising:
   (a) a substrate comprising:
      (1) a base substrate;
      (2) an interfacial bonding layer disposed on the base substrate; and
      (3) a thin film adaptive crystalline layer disposed on the interfacial bonding layer, wherein:
         the interfacial bonding layer is solid at approximately 100° C. and acquires a liquid-like form at a bonding layer melting point lower than the melting points of the base substrate and the thin film adaptive crystalline layer;
         the thin film adaptive crystalline layer has a degree of flexibility to expand or contract its lattice constant along a direction parallel to a surface of the substrate when the interfacial bonding layer is in liquid-like form; and
         the base substrate is mechanically strong enough to support the interfacial bonding layer and the thin film adaptive crystalline layer thereon; and
   (b) an optoelectronic device epitaxially grown on the thin film adaptive crystalline layer.

20. The optoelectronic apparatus of claim 19, wherein the optoelectronic device is a semiconductor laser.

21. The optoelectronic apparatus of claim 19, wherein the interfacial bonding layer has a finite thickness sufficient to provide the thin film adaptive crystalline layer with said degree of flexibility when the interfacial bonding layer is in liquid-like form and the interfacial bonding layer is thin enough that its surface tension will not destroy the thin film adaptive crystalline layer when the interfacial bonding layer is in liquid-like form.

22. The optoelectronic apparatus of claim 19, wherein the thin film adaptive crystalline layer comprises approximately the same crystalline lattice structure as $In_x(Al_yGa_{1-y})_{1-x}As$, wherein x is approximately 15% to approximately 45%.

23. The optoelectronic apparatus of claim 19, wherein the bonding layer melting point is less than approximately 600° C.

24. The optoelectronic apparatus of claim 19, wherein the thin film adaptive crystalline layer comprises InGaAs with an In composition between approximately 15% and approximately 45%.

25. The optoelectronic apparatus of claim 19, wherein the interfacial bonding layer comprises multiple thin metal films, wherein at least some of the films have a liquid-like form at the bonding layer melting point.

26. The optoelectronic apparatus of claim 19, wherein the expansion or contraction of the lattice constant accommodates material epitaxial growth.

27. The optoelectronic apparatus of claim 19, wherein the bonding layer melting point is less than approximately 700° C.

28. The optoelectronic apparatus of claim 19, wherein the bonding layer melting point is less than approximately 500° C.

* * * * *